(12) United States Patent
Krassnitzer et al.

(10) Patent No.: US 8,864,959 B2
(45) Date of Patent: Oct. 21, 2014

(54) METHOD FOR MANUFACTURING WORKPIECES WITH ION-ETCHED SURFACE

(75) Inventors: Siegfried Krassnitzer, Feldkirch (AT); Oliver Gstoehl, Balzers (LI); Markus Esselbach, Feldkirch (AT)

(73) Assignee: Oerlikon Trading AG, Truebbach, Truebbach (CH)

( * ) Notice: Subject to any disclaimer, the term of this patent is extended or adjusted under 35 U.S.C. 154(b) by 1190 days.

(21) Appl. No.: 12/427,021

(22) Filed: Apr. 21, 2009

(65) Prior Publication Data
US 2009/0260977 A1 Oct. 22, 2009

Related U.S. Application Data

(60) Provisional application No. 61/046,877, filed on Apr. 22, 2008.

(51) Int. Cl.
| | | |
|---|---|---|
| C23C 14/00 | (2006.01) | |
| C23C 14/32 | (2006.01) | |
| C25B 9/00 | (2006.01) | |
| C25B 11/00 | (2006.01) | |
| C25B 13/00 | (2006.01) | |
| B44C 1/22 | (2006.01) | |
| C03C 15/00 | (2006.01) | |
| C03C 25/68 | (2006.01) | |
| C23F 1/00 | (2006.01) | |
| C23C 16/00 | (2006.01) | |
| H01J 37/32 | (2006.01) | |

(52) U.S. Cl.
CPC ............ *H01J 37/32* (2013.01); *H01J 2237/334* (2013.01)
USPC .............. 204/192.32; 204/192.1; 204/192.35; 204/298.01; 204/298.27; 204/298.28; 204/298.31; 204/298.36; 118/730; 216/66; 216/67; 216/94

(58) Field of Classification Search
USPC .......... 118/730; 204/192.34, 298.27, 298.28, 204/298.36, 298.37, 192.1, 192.32, 192.35, 204/298.01, 298.31; 216/66, 67, 94
See application file for complete search history.

(56) References Cited

U.S. PATENT DOCUMENTS

| | | |
|---|---|---|
| 5,294,322 A | 3/1994 | Vetter et al. |
| 5,709,784 A | 1/1998 | Braendle et al. |

(Continued)

FOREIGN PATENT DOCUMENTS

| | | | |
|---|---|---|---|
| EP | 0885981 A2 | 12/1998 | |
| JP | 63094545 A | * | 4/1988 |

(Continued)

OTHER PUBLICATIONS

Written Opinion for PCT/EP2009/054463 dated Nov. 4, 2010.

*Primary Examiner* — Michael Band
(74) *Attorney, Agent, or Firm* — Pearne & Gordon LLP

(57) ABSTRACT

Planetary carriers (22) for workpieces mounted on a carousel (19) are provided within a vacuum chamber. A source (24) for a cloud comprising ions (CL) is provided so that a central axis ($A_{CL}$) of the cloud intercepts the rotary axis ($A_{20}$) of the carousel (19). The cloud (CL) has an ion density profile at the moving path (T) of planetary axes ($A_{22}$) which drops to 50% of the maximum ion density at a distance from the addressed center axis ($A_{CL}$) which is at most half the diameter of the planetary carriers (22). When workpieces upon the planetary carriers (22) are etched by the cloud comprising ions material which is etched off is substantially not redeposited on neighboring planetary carriers but rather ejected towards the wall of the vacuum chamber.

11 Claims, 11 Drawing Sheets

(56) References Cited

U.S. PATENT DOCUMENTS

Figure 1:
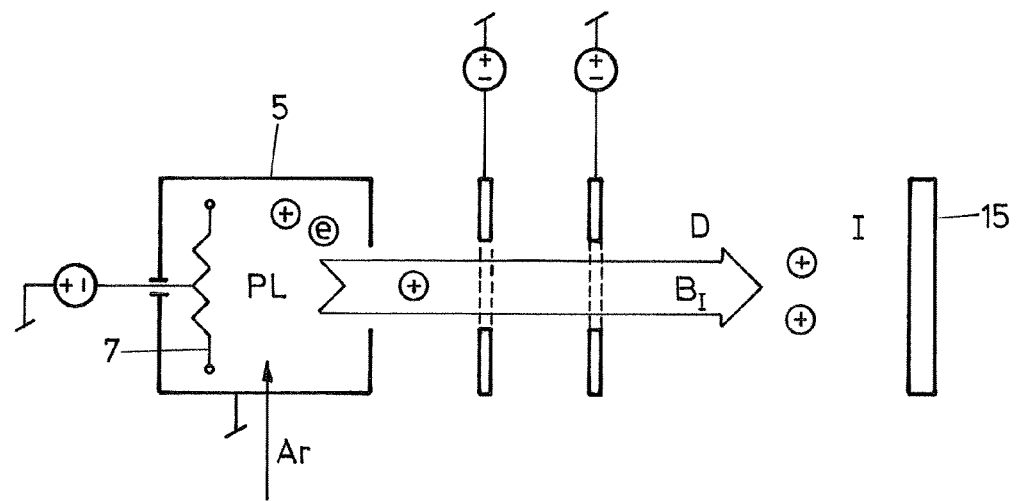

| | | |
|---|---|---|
| 6,236,163 B1 | 5/2001 | Maishev et al. |
| 6,984,943 B2 | 1/2006 | Ono et al. |
| 2002/0053322 A1 | 5/2002 | Seeli et al. |
| 2007/0209926 A1* | 9/2007 | Lee et al. .................. 204/192.1 |

FOREIGN PATENT DOCUMENTS

| | | | |
|---|---|---|---|
| JP | 02159389 A | * | 6/1990 |
| WO | 9100378 A1 | | 1/1991 |
| WO | 2006/099758 A2 | | 9/2006 |

* cited by examiner

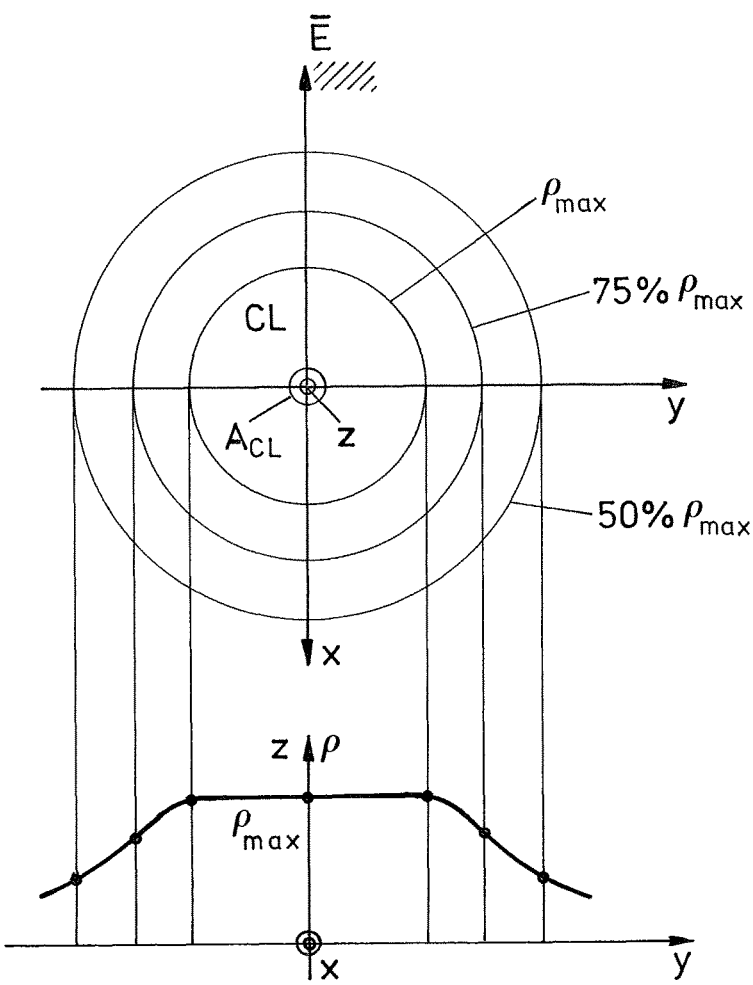

METHOD FOR MANUFACTURING WORKPIECES WITH ION-ETCHED SURFACE

The present invention is generically directed on etching the surfaces of workpieces by ion impact, thereby at least lowering the amount of material which is etched off such surfaces to be redeposited on other workpieces of a workpiece batch or on other surface areas of the same workpiece being etched.

DEFINITIONS

We understand under "etching by ion impact" a vacuum etching process, in which ions are impinging on a surface to be etched so as to knock out material of the surface by impact. Thereby, such etching may be realized practically exclusively by ion impact, but may also be performed by additionally activating a reactive gas adjacent to the surface of a workpiece to be etched, so that such activated gas contributes to the etching process.

Now a "cloud comprising ions" shall be defined.

We understand under a cloud comprising ions a limited space area in vacuum wherein there is present a density of positive ions which is higher than in the surrounding vacuum. Thereby we define the border of such ion cloud as the locus where ion density drops to 50% of the maximum ion density within the cloud.

To establish the border of the ion cloud to be properly located with respect to workpieces to be etched and as will be exemplified later, one or more than one dummy workpiece may be introduced in the respective etching apparatus and immersed into the cloud containing ions. After a predetermined period of time the dummy is removed and it is checked where 50% etching effect, of maximum etching effect on the dummy workpiece, is reached. Thereby, the locus of the border of the cloud is found. According to the result the source for generating the cloud and/or position of the workpiece relative to such source is adjusted so as to result in the border of the cloud located where it is desired.

Another possibility to check where the addressed border is located in situ is performing measurements as by Langmuir probes.

The movement distribution of the ions may be random. This is the case in a plasma discharge remote from the electrodes. Adjacent the electrode acting as a cathode i.e. through the cathode sheath often also called cathode dark space, the ions are attracted towards the cathode by the electric potential difference of plasma potential and cathode potential. If a solid surface is immersed into the plasma there results at the interface a sheath as well and the surface is exposed to etching ion impact even if operated at a floating potential. The etching rate may be increased by biasing such surface on negative potential with respect to plasma potential, i.e. on cathodic potential. In the case of biasing the ion movement distribution has a preference direction towards the addressed surface, without such biasing the movement distribution is random.

The ion movement distribution within a cloud comprising ions has a pronounced direction if the cloud is present as an ion beam practically exclusively consisting of ions as may be generated e.g. by extracting ions with the help of grids from a remote plasma and accelerating such ions in one direction towards a surface to be etched. The addressed predominant moving direction of the ions in this kind of cloud is established by the respective extraction and acceleration of the ions out of the plasma towards a target surface.

So as to further exemplify what is to be understood under a cloud containing ions in the present description and claims, FIG. 1 schematically shows an arrangement for generating a beam-like cloud comprising ions which beam practically consists of ions. As perfectly known to the skilled artisan there is generated in a plasma chamber 5, e.g. with a thermionic cathode 7 and the wall of the chamber 5 operated as an anode, by inletting a noble gas, as of Argon, a plasma discharge PL. Plasma PL comprises electrons as well as positive ions of the noble gas. By means of an arrangement of accelerating grids or diaphragms 9 on high negative electric potential with respect to the wall of plasma chamber 5 the positive ions are extracted from the plasma and accelerated in a predominant direction D. There results a beam $B_I$ practically exclusively consisting of ions I which beam may be led e.g. by means of electrostatically attracting and repelling grids also along a curved trajectory towards a remote target 15. Here the cloud comprising ions has a pronounced beam shape and the ions have a predominant direction of movement.

Figure 2:
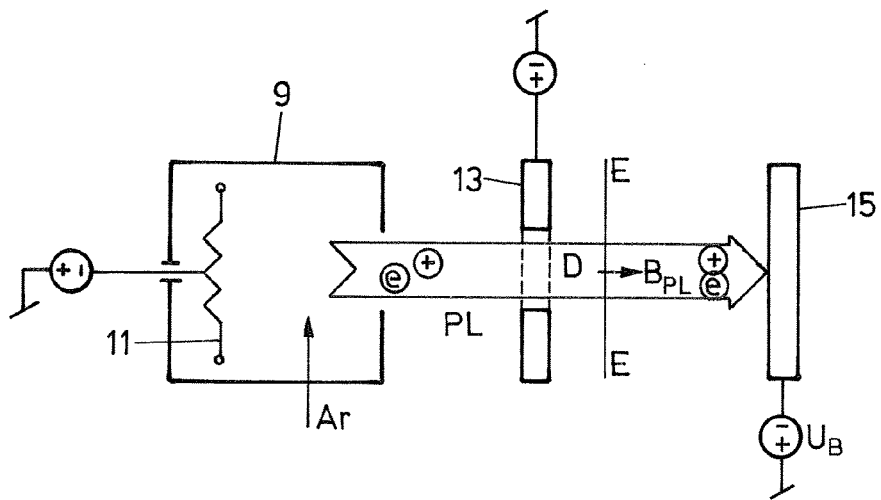

In FIG. 2 there is schematically shown generating a cloud comprising ions which is a plasma beam containing electrons as well as positive ions. Thereby, as an example, there is again provided in a plasma chamber a thermionic cathode 11. The plasma chamber 9 may thereby be operated on electrically floating potential. An anode 13 cooperates with the cathode 11 for generating a plasma beam $B_{PL}$. A predominant moving direction D of ions in the plasma is established by biasing the target 15 on a cathodic potential, i.e. on a negative bias voltage UB so as to attract ions out of the plasma PL and to repel electrons of the plasma which do not contribute to target etching. Nevertheless, there remain electrons in the beam $B_{PL}$ even adjacent to the target 15. Thus here the cloud containing ions is a plasma beam wherein the ions have a predominant moving direction.

Figure 14:
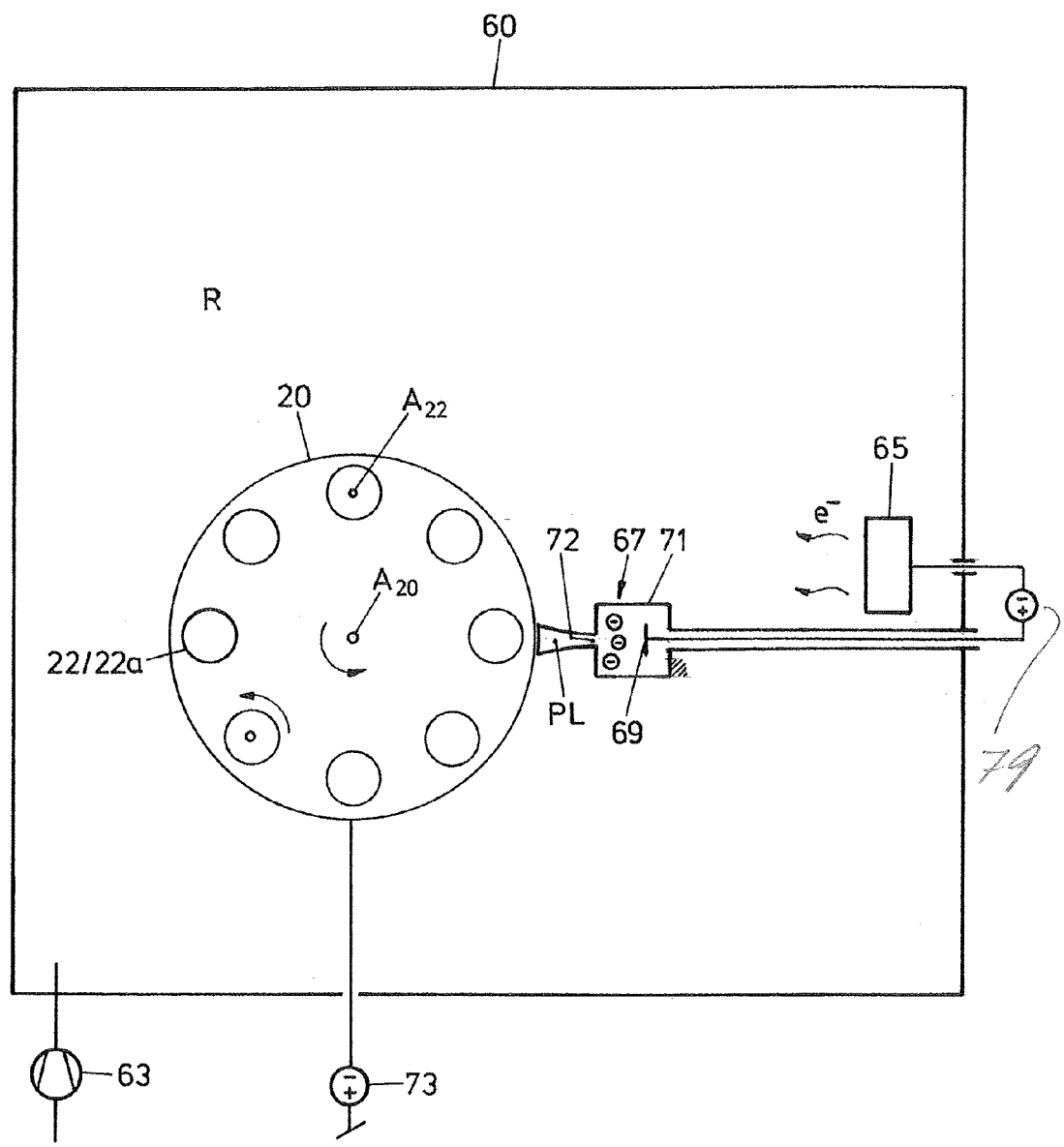

A third mode of generating a cloud containing ions is shown in FIG. 14. An anode cooperates with a source of electrons, a remote cathode 65. The electrons ionize a working gas just in front of the anode 69 in a confinement 71 which is operated on a floating potential with respect to anode 69 and electron source 65. The confinement shapes the plasma PL emerging therefrom. In the plasma the ions have no predominant moving direction. If a solid material surface is immerged in the plasma, at a floating electric potential, the sheath resulting at the plasma/solid interface provides for ion acceleration towards the solid surface which already suffices for surface etching. Nevertheless, the cloud containing ions in this case has per se no predominant direction of ion movement. The etching effect on the solid surface may be increased by applying electric potential thereto, a bias potential, which is negative with respect to the plasma potential of the plasma PL.

As for etching the impact of the ions is responsible it may be seen that by all three categories of cloud, $B_I$ as of FIG. 1 and $B_{PL}$ as of FIG. 2 and plasma PL as of FIG. 14 a target surface becomes etched.

FIGS. 3 to 6 shall exemplify how we define the border of a cloud containing ions. FIG. 3 schematically shows ion density distribution ρ of a cloud CL comprising ions considered in cross-sectional plane through the cloud, e.g. along plane E according to FIG. 2. In this case the cloud is substantially symmetrical to an axis $A_{CL}$ in z direction which is centered in a central area of maximum ion density $\rho_{max}$. The ion density drops e.g. to 75 and 50% etc. of the maximum ion density $\rho_{max}$ substantially along predetermined circular loci. We consider the border or limit of the cloud at the locus 50% $\rho_{max}$.

FIG. 4 shows the resulting qualitative ion density—ρ(y)— distribution.

Figure 5:
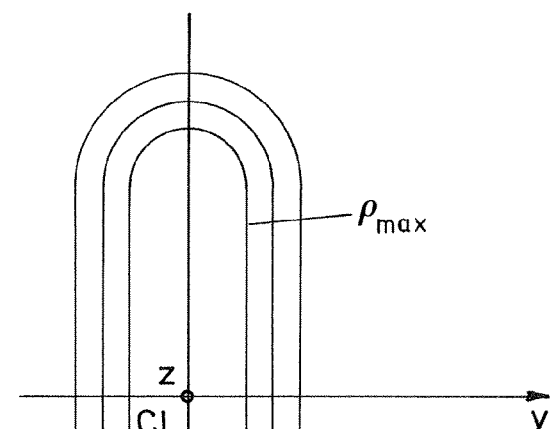
Figure 6:
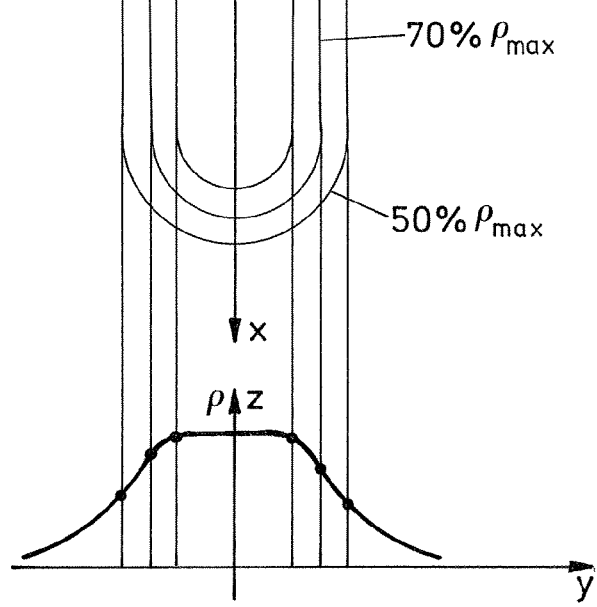

In FIG. 5 there is shown in analogy to FIG. 3, purely qualitatively, the ion density distribution of a cloud CL which is linearly elongated in one direction—x—considered in the cross-sectional plane through the cloud. In FIG. 6 the density distribution in the plane z/y is shown. The central plane according to the x/z-plane is the center locus of the area of maximum ion density $\rho_{max}$.

Figure 7:
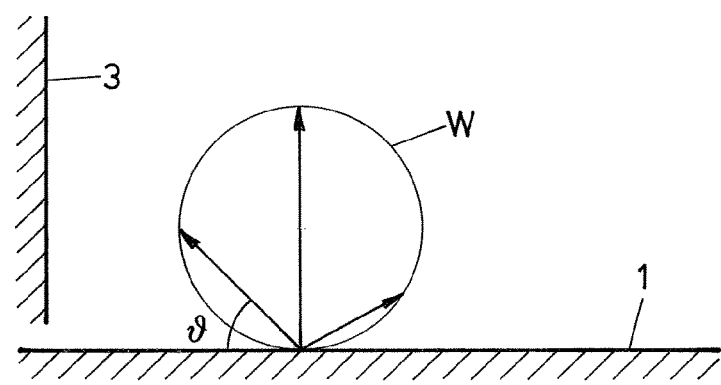

It is perfectly known, that when ions impinge with high enough energy on a material surface, due to impact, material is freed from such surface into the surrounding vacuum atmosphere, with a spatial probability distribution according to the so-called "Cosine Law". As schematically shown in FIG. 7, probability of material freed into the surrounding vacuum atmosphere depends on spatial direction θ according to the distribution W. Thus, still with an eye on FIG. 7, if material is ion-etched from a surface 1 of a workpiece and there is present, as schematically shown in FIG. 7 a surface 3, a certain amount of material etched from surface 1 will redeposit on surface 3. This is especially disadvantageous if the surface 3 is a surface which is also to be etched or, more generically, is a surface whereupon no etched material shall be deposited. If the surface 3 is a surface too which shall be etched, then overall etching efficiency is significantly lowered by the fact that a part of the material momentarily etched off one surface area is redeposited on another surface area which already has been etched or which will have to be etched.

The present invention addresses this problem generically for a batch of workpieces to be sputter-etched. In such a case overall etching efficiency is significantly lowered if material etched from one workpiece is redeposited on other workpieces of the batch.

There is proposed a method for manufacturing workpieces, at least a part of the surface of the addressed workpieces being etched including etched by ion impact. A carousel base is drivingly rotatable about a carousel axis. Along the periphery of and on the addressed carousel base at least two planetary carriers are provided, each drivingly rotatable about a planetary axis parallel to the carousel axis. There is generated a cloud comprising ions which has, considered in a cross-sectional plane perpendicular to the carousel and the planetary axis, a center axis in a center area of maximum ion density.

The center axis is directed so as to intersect with the carousel axis, still considered in the cross-sectional plane perpendicular to the carousel and the planetary axes. There is applied at least one workpiece to be etched on each of the planetary carriers, whereby each of the planetary carriers defines by rotation about its planetary axis for a diameter, still considered in the addressed cross-sectional plane, with respect to such planetary axis. Further, the cloud comprising ions has an ion density which drops to 50% of maximum ion density of the beam at a distance from the center axis, which is at most half of said diameter at the locus of moving path of the planetary axes. The carousel base as well as the planetary carriers is drivingly rotated about respective axes and the respective workpieces are etched as moved into and through the addressed cloud.

Providing a batch of workpieces as e.g. cutting tools or and especially workpieces for automotive industry, as tappets, nozzle needles, control pistons, wrist pins, finger followers, plungers, rollers and shoes etc. supported on a carousel/planetary carrier arrangement for vacuum treatment is widely known.

By the addressed method it is substantially prevented that material which is momentarily etched from workpieces on one planetary carrier is redeposited on workpieces on another planetary carrier. Additionally etching of complexly shaped workpiece surfaces, e.g. concave surfaces, is significantly improved.

In one embodiment of the addressed method whereat the planetary carriers are extended in direction of their axes, the cloud is generated substantially linearly extended in a direction parallel to the planetary axes. There is thus generated a sheet-like cloud defining for a center plane which comprises the carousel axis.

In a further embodiment the workpieces are applied eccentrically with respect to the respective planetary axis and are preferably rotated each about a workpiece axis. Latter is performed if the workpiece surface to be etched extends all around the workpieces.

In a further embodiment redeposition of material momentarily etched from workpieces to other workpieces is additionally prevented by mutually shielding the workpieces.

In a further embodiment focusing or concentrating of addressed etching on a workpiece is further increased by selectively applying a higher negative bias voltage to that workpieces which are momentarily etched than to workpieces which are momentarily not etched.

In a further embodiment generating the cloud comprises shaping the cloud by a diaphragm. This is done in one of the following manners, namely through an electrically floating metallic diaphragm or through a dielectric diaphragm or through such diaphragm operated as an anode.

If the metallic diaphragm is operated on a floating electrical potential this is relative to the electrical potential of the cloud. If the cloud is a plasma thus either the plasma potential is bound to a reference potential as by selecting the potential of an anode or of a cathode for plasma generation to be a reference potential, e.g. ground potential, and the potential of the diaphragm is floating, or the diaphragm is operated on a reference potential and the plasma potential is floating, by operating neither the cathode nor the anode for plasma generation on a reference potential.

A diaphragm operated as an anode and thus on positive electric potential acts as a focusing member on the cloud with respect to its ions which are electrically positive.

In a further embodiment generating the cloud comprises applying a magnetic field along the cloud.

In one embodiment the cloud is generated as a plasma, thus containing the addressed etching ions as well as electrons. It is especially in this case that applying to the workpieces being etched a negative bias potential is of significant advantage, because by doing so the positive etching ions are attracted on one hand and the electrons are repelled, thereby avoiding heating up of the workpieces by electron current.

Further, in one embodiment ion density of the cloud is even more restricted to a specific small area by selecting the addressed distance at which ion density drops to 50% $\rho_{max}$ to be at most a quarter of the addressed diameter.

There is further proposed an ion cloud etching apparatus which comprises a carousel base drivingly rotatable about a carousel axis. The apparatus further comprises at least two planetary carriers which are drivingly mounted adjacent to the periphery of and on the carousel base and which are drivingly rotatable about respective planetary axes which are parallel to the carousel axis.

Each of the planetary carriers defines for a diameter with respect to its planetary axis.

There is further provided a source generating a cloud comprising ions which has, considered in a cross-sectional plane perpendicular to the carousel and the planetary axes, a center axis which intersects, still in the addressed plane, the carousel axis. The cloud axis is defined in the center of an area of maximum ion density considered in the addressed plane.

Each of the at least two planetary carriers comprises at least one workpiece support for a workpiece. The cloud comprising ions has an ion density which drops to 50% of maximum ion density of the cloud at a distance from the beam axis which is at most 50% of the diameter of the planetary carriers considered in the addressed cross-sectional plane and at the locus of moving path of the planetary axes around the carousel axis.

In one embodiment of the addressed apparatus the cloud which comprises ions extends substantially linearly in direction parallel to the planetary axes.

In a further embodiment of the apparatus each of the planetary carriers comprises workpiece supports adjacent to its periphery which supports are preferably drivingly rotatable about a respective support axis.

Still in a further embodiment according to the invention the apparatus comprises a shield between neighboring planetary carriers which is stationary with respect to the carousel base and which extends radially with respect to the carousel axis. By such a shield redeposition of material momentarily etched from workpieces on one of the planetary carriers upon workpieces on further, especially neighboring planetary carriers, is additionally reduced.

Still in a further embodiment and whenever the planetary carriers comprise workpiece supports adjacent their periphery which are preferably per se rotatable, there is provided a shield between neighboring of the addressed workpiece supports mounted on respective ones of the planetary carriers and extending radially with respect to respective ones of the planetary axes. By this shield redeposition of material momentarily etched from workpieces is prevented to be redeposited on workpieces supported on one and the same planetary carrier.

The addressed shield, be it between neighboring planetary carriers and/or between workpiece supports on the planetary carriers, are in one embodiment made of metal and operated electrically floatingly or are of dielectric material.

Whereas the addressed shields as addressed to now are provided more under the aspect of preventing transition of etched off material from one workpiece to another, in a further embodiment an approach is addressed according to which workpieces are protected from being contaminated by etched-off material from other workpieces. This is achieved by providing around each of the planetary carriers a shielding member which is mounted on the carousel base and which has an opening which is directed radially outwards with respect to the carousel axis.

If at the planetary carriers there are provided workpiece supports as was addressed above, in a further embodiment shielding members are provided around each of the workpiece supports, each of said shielding members having an opening which is directed radially outwards with respect to the respective planetary axis.

Again, the just addressed shielding members around the planetary carriers and/or the workpiece supports are in one embodiment either made of metal and operated in an electrically floating manner or are made of a dielectric material.

In a further embodiment there is provided an electric supply for biasing the workpiece supports so as to attract ions of the beam.

In a further embodiment there is provided a bias control unit which controls the bias as just addressed to be higher when a respective one of the workpiece supports is immersed in the cloud than when such support is not immersed in the cloud.

Still in a further embodiment there is provided a diaphragm along the cloud which is either an electrically floating metallic diaphragm or a dielectric material diaphragm or which is operated as an anode. With respect to operating such diaphragm on floating electric potential we refer to the explanation to this subject as given above.

Still in a further embodiment there is provided a coil arrangement, which generates a focusing magnetic field along the cloud.

Still in a further embodiment the source which generates the cloud comprising ions is a plasma source and the cloud is a plasma.

Due to the present invention whenever batches of workpieces, e.g. of a type as addressed above, are etched on a carousel/planetary carrier arrangement, redeposition is avoided or at least substantially reduced.

The present invention shall now be further exemplified with the help of figures.

Figure 8:
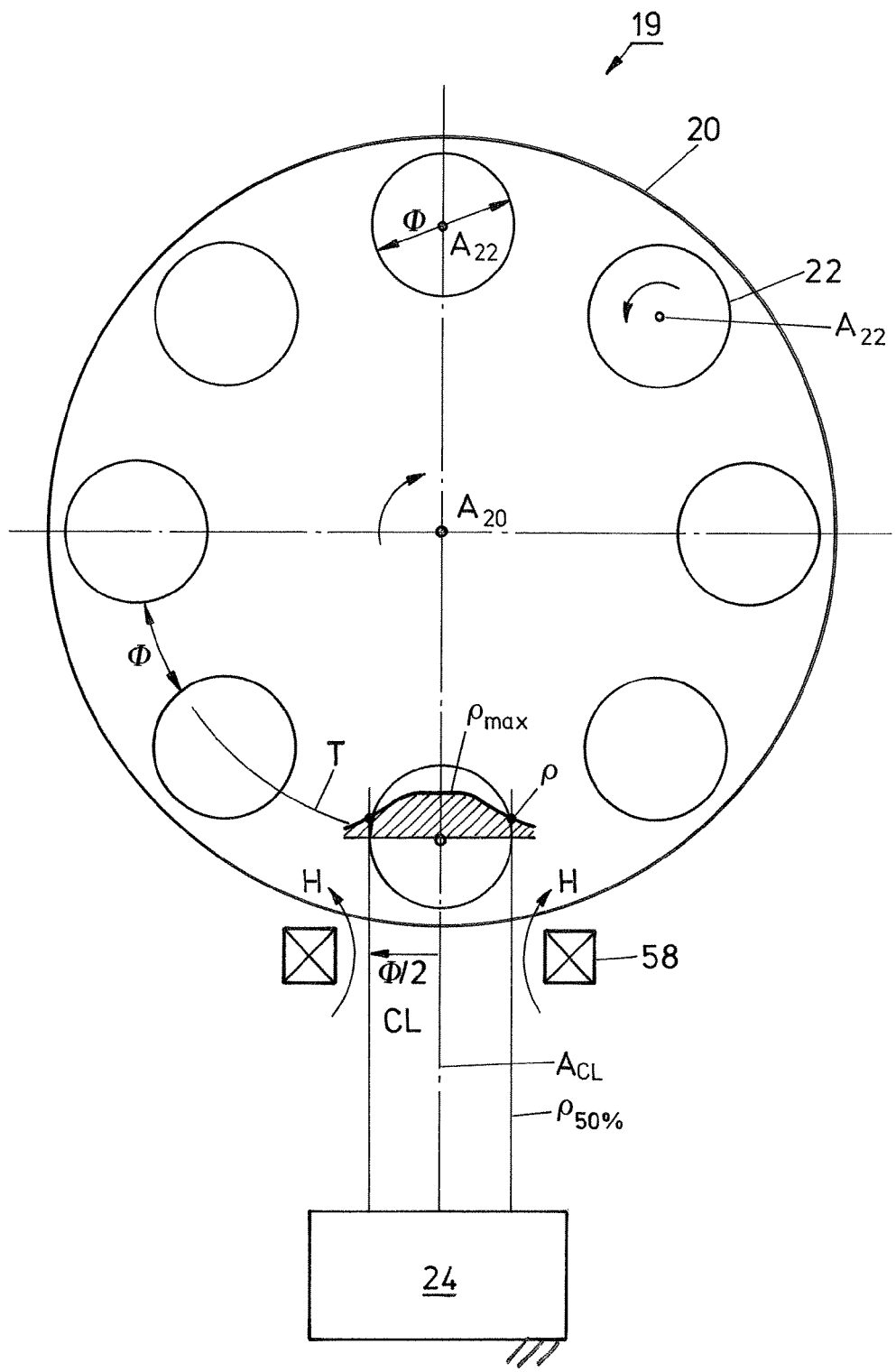
Figure 9:
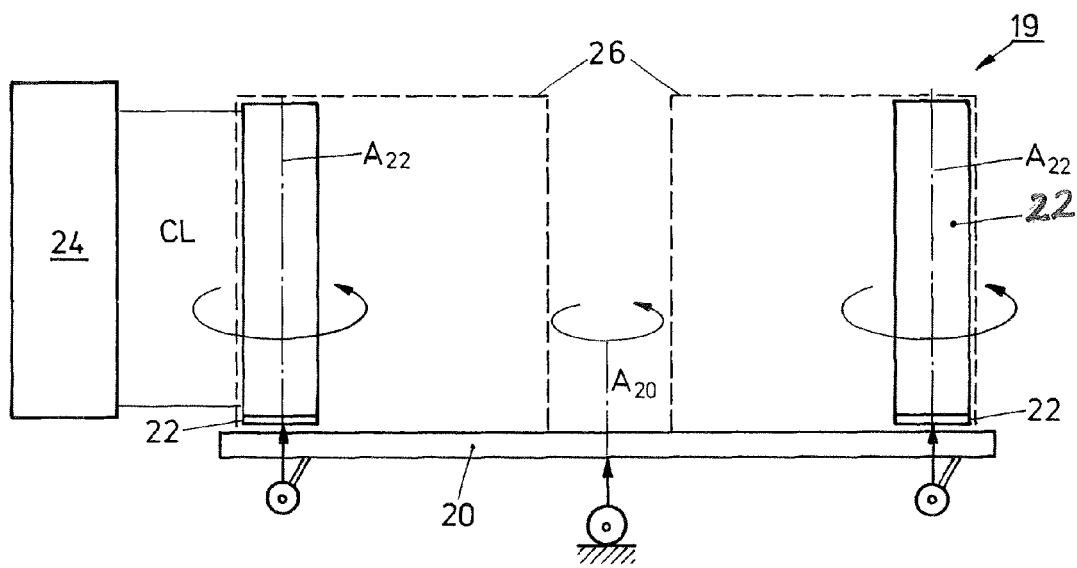
Figure 10:
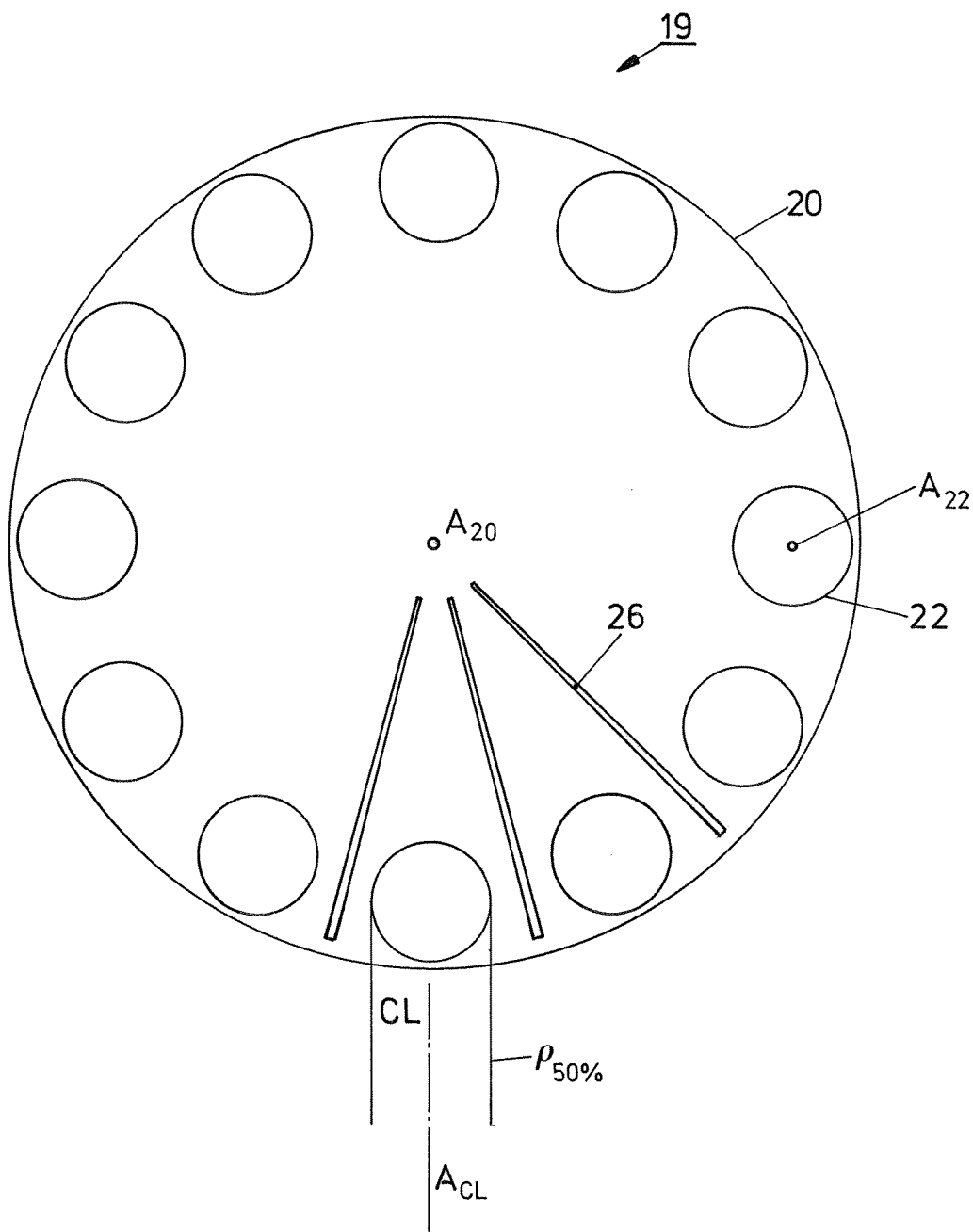
Figure 11:
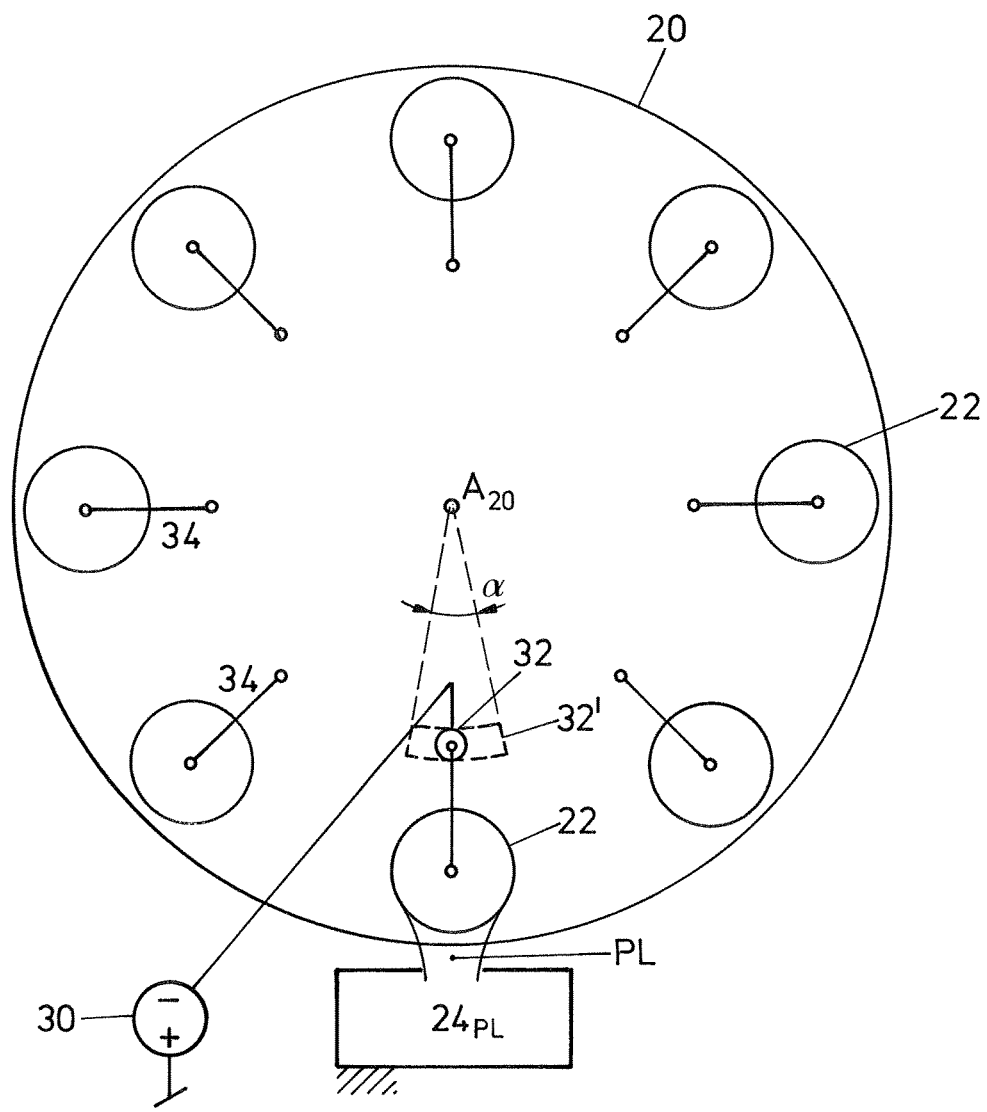
Figure 12:
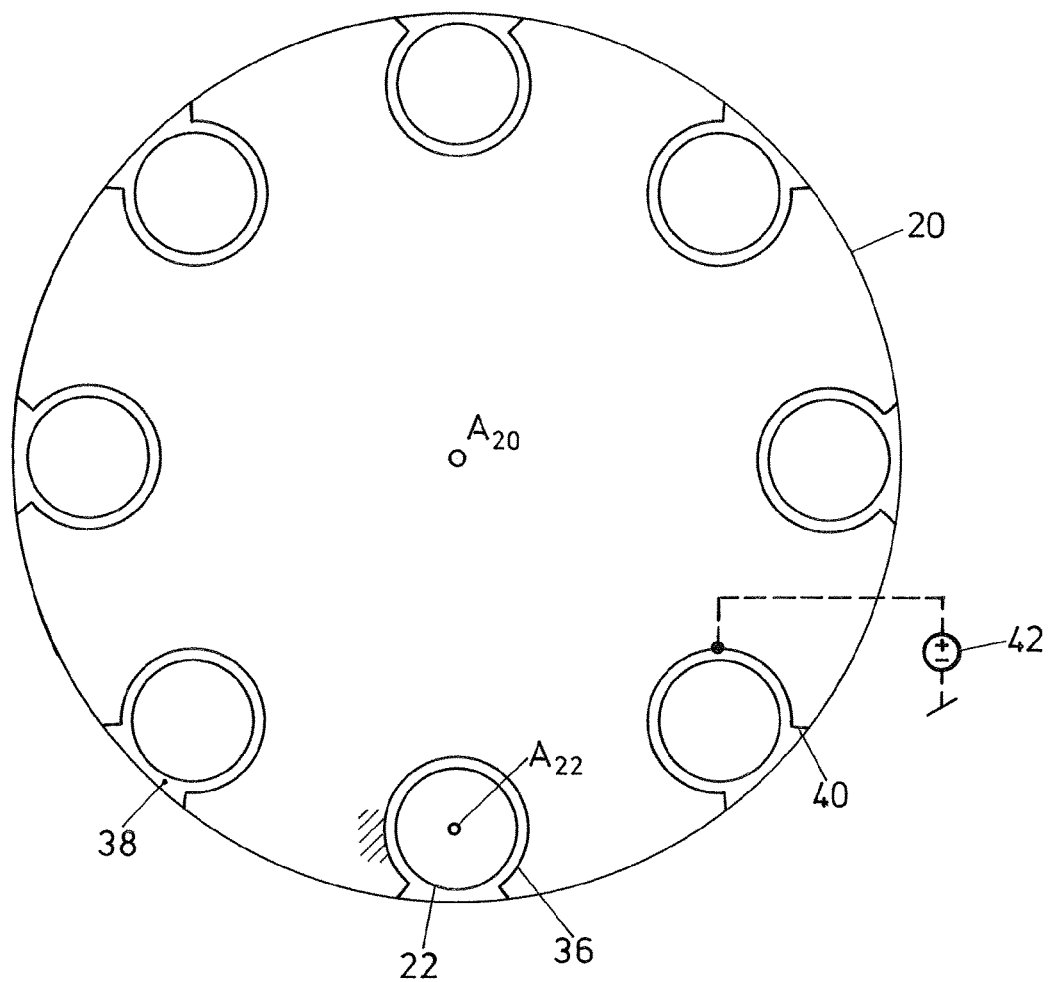
Figure 13:
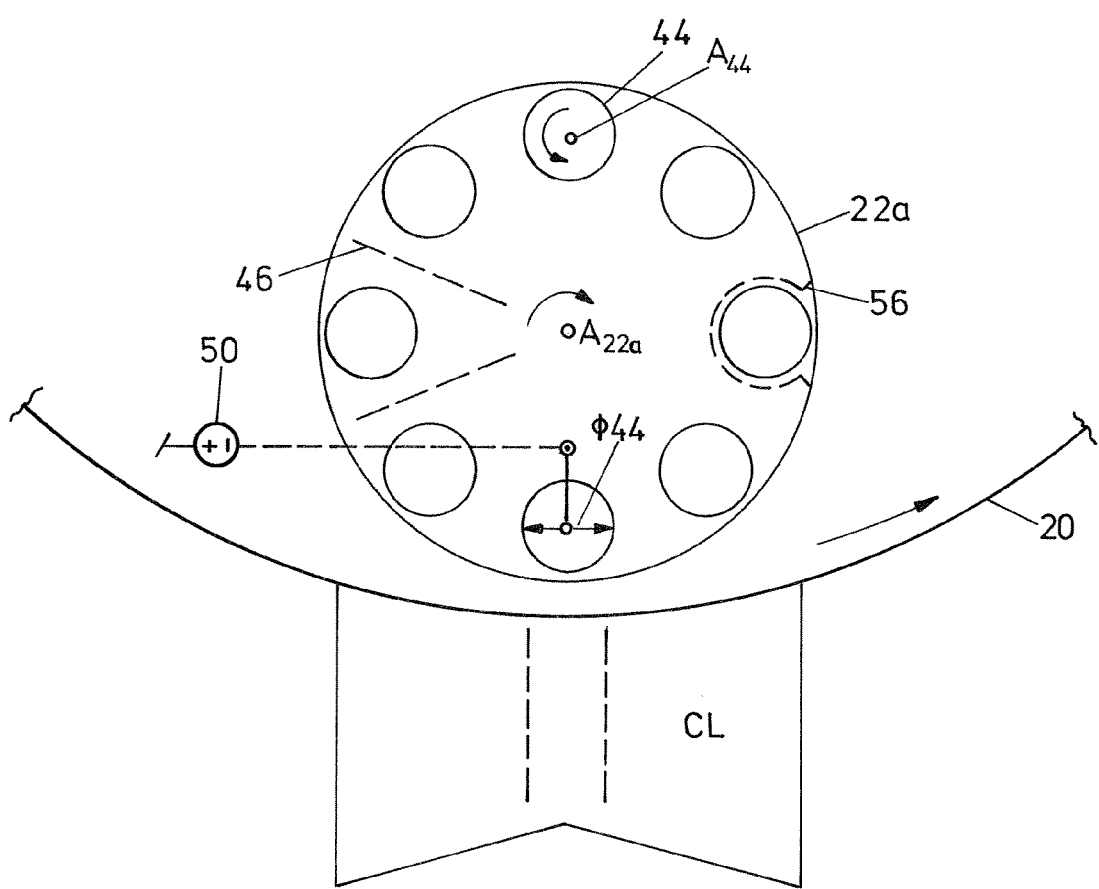
Figure 15:
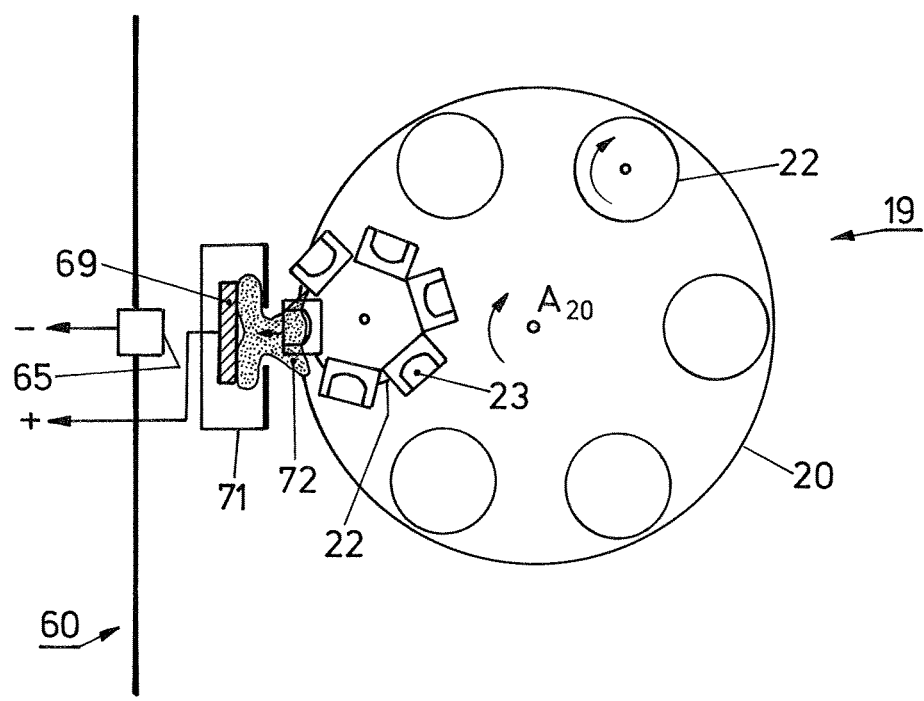

The figures show:

FIG. 1 purely schematically and simplified, a source for generating a cloud comprising ions which practically consists of ions as one type of such cloud;

FIG. 2 in a representation in analogy to that of FIG. 1, a source generating a plasma beam as a further type of a cloud comprising ions;

FIG. 3 schematically and qualitatively, an ion density distribution in a centrally symmetric cloud comprising ions;

FIG. 4 the addressed ion density distribution in a representation along a cross-sectional direction through the cloud;

FIG. 5 in a representation in analogy to that of FIG. 3, the ion density distribution in a linearly extended cloud and FIG. 6 in analogy to the representation of FIG. 4, the ion density distribution in the cloud according to FIG. 5;

FIG. 7 in a schematic representation, the effect of the cosine law sputtering showing the resulting redeposition problem;

FIG. 8 in a simplified and schematic representation, a first embodiment according to the present invention;

FIG. 9 still schematically and simplified, a side view of the embodiment according to FIG. 8;

FIG. 10 in a representation according to that of FIG. 8, additional measures for minimizing etching redeposition on neighboring planetary carriers of the carousel/planetary arrangement as of FIG. 8;

FIG. 11 departing from an embodiment as shown in FIG. 8 which may also be combined with the embodiment of FIG. 10, a further embodiment with additional measures for further preventing redeposition by controlled workpiece biasing;

FIG. 12 still departing from an embodiment according to FIG. 8 and possibly combined with the embodiment of FIG. 10 and/or of FIG. 11, further measures to prevent redeposition by protective shielding;

FIG. 13 in a representation in analogy to that of FIG. 8, an arrangement in which drivingly rotatable workpiece supports are provided at respective planetary carriers and with measures to reduce redeposition which may be applied separately or in combination;

FIG. 14 purely schematically, a plasma source as applied today for practicing the present invention and based on a plasma source as disclosed in the PCT/EP2006/067869, and the plasma thereby generated being a further type of a cloud comprising ions, and FIG. 15 schematically, an arrangement according to FIG. 14 for etching workpieces with complex surfaces.

In FIG. 8 there is schematically shown a first embodiment of an apparatus for batch etching workpieces according to the present invention. There is provided in a vacuum chamber (not shown) a carousel 19 having a carousel base 20. Latter is drivingly rotatable about a carousel axis $A_{20}$. Adjacent to the periphery of the carousel base 20 there are provided at least two, according to FIG. 8 e.g. eight, planetary carriers 22 of the carousel 19, each of which being drivingly rotatable about a planetary axis $A_{22}$, which is mounted on the carousel base 20. Outside the carousel 19 is provided a source 24 generating a cloud CL comprising ions. Under consideration of what we understand under a "cloud comprising ions" and as was defined in context with FIGS. 1 and 2 and 14, any source for such a cloud may be used as source 24, so e.g. hollow cathode sources, thermical emission ion sources, arc evaporation sources or ion sources as e.g. commercially available from the Fa. Veeco.

A source 24 as today applied for realizing the present invention will later be described in more details in context with FIG. 14.

The source 24 generates a cloud CL which has, considered in the cross-sectional plane of drawing according to FIG. 8 and thus in a plane perpendicular to the carousel axis $A_{20}$ as well as to the planetary axes $A_{22}$ a center axis $A_{CL}$ which intersects the planetary axis $A_{20}$ and is thus, still considered in the addressed plane, radially aligned to the addressed axis.

Each of the planetary carriers 22 defines by rotation for a diameter $\Phi$ with respect to its planetary axis $A_{22}$. The cloud CL as generated by source 24 has an ion density profile at the locus of the moving path T of the planetary axes $A_{22}$ which drops to 50% of the maximum ion density $\rho_{max}$ at a distance from the center axis $A_{CL}$ which is at most $\Phi/2$ and even preferred $\Phi/4$. Thus, whenever one of the planetary carriers 22 becomes aligned with the center axis $A_{CL}$ of the cloud CL considered in the addressed cross-sectional plane, its outermost areas with respect to axis $A_{22}$ and perpendicular to the center axis $A_{CL}$, are exposed to an ion density which is at most 50% of the maximum ion density $\rho_{max}$ of the cloud CL. Thereby, predominant etching is performed by ions of the cloud CL which hit at the surface area of the planetary carriers which are perpendicular to the center axis $A_{CL}$. Material which is etched off that area is not redeposited on neighboring planetary carriers, but rather ejected towards the wall of the vacuum chamber (not shown). Ions out of the cloud which hit the planetary carrier 22 laterally spaced from center axis $A_{CL}$ on one hand have a lower etching efficiency and are of reduced density $\rho$, so that, additionally considering the cosine distribution W of FIG. 7, only small amounts of etched off material will redeposit on neighboring planetary carriers 22.

In FIG. 9 there is schematically shown the arrangement of FIG. 8 in a side view. The considerations with respect to etching and redeposition as have been discussed up to now are especially valid if there is provided on the planetary carrier 22 a substantially cylindrical workpiece as schematically shown at 24 of FIG. 9 or a multitude of workpieces which are grouped along a cylindrical surface upon the planetary carriers 22 and which are only to be etched at surface areas radially pointing outwards with respect to the axis $A_{22}$.

A further improvement with respect to preventing redeposition of etched off material on workpieces of the batch is achieved by the embodiment according to FIG. 10. From FIG. 8, it is evident that the remaining redeposition will become the more accentuated the closer than the planetary carriers 22 are mutually arranged along the periphery of the carousel base 20. Therefore, a space should be maintained between neighboring planetary carriers 22 in the embodiment of FIG. 8 which accords at least to the diameter $\Phi$ as schematically shown in FIG. 8. To allow reducing such spacing without increasing redeposition, according to FIG. 10 in one embodiment neighboring planetary carriers are mutually shielded. Such shielding is performed by shielding plates 26 which are mounted radially with respect to the carousel axis $A_{20}$ on carousel base 20. These shielding members 26—shown in dash line also in FIG. 9—may be made replaceably fixed on the carousel base 20 so as to be easily replaced when a predetermined amount of material has been redeposited thereon.

As we have explained a cloud comprising ions may be realized by a plasma, wherefrom the etching ions are attracted onto the surface to be etched by negatively biasing the workpiece. Negatively biasing the workpiece may nevertheless generically add to the energy of the ions of the beam, but such biasing is especially to be performed when exploiting a plasma. E.g. with an eye on FIG. 8 the more that the cloud CL is bundled or focused as impinging on a planetary carrier 22, the less etched off material will be redeposited on workpieces carried on neighboring planetary carriers 22. Further, as was already addressed with an eye on FIG. 8 without additional measures, the mutual azimutal distance between neighboring planetary carriers 22 should not be smaller than a distance according to the diameter $\Phi$ of the planetary drives. This to avoid that whenever the cloud CL transits between two neighboring planetary carriers, workpieces supported thereon become substantially etched simultaneously, leading to the etched material being cross-wise redeposited. Thus, in a further embodiment and especially when realizing the cloud as a plasma the workpieces on the planetary carriers are only biased on a negative electric potential so as to attract the etching ions when a planetary carrier is located just in front of the plasma. There is thus provided a controlled bias supply for the workpieces, by which only workpieces are supplied with a biasing voltage which are immersed in the cloud CL. Such an embodiment is shown in FIG. 11 in a schematic and simplified representation. A bias supply source 30 has a contact 32 which is stationary at a position facing source 24. Each of the planetary carriers 22 has a planetary contact 34 which is stationary with respect to the carousel base 20. From the planetary contacts 34 there is established an electrical connection (not shown) e.g. via planetary axis $A_{22}$ to the workpiece supports provided on the planetary carriers 22. The planetary contacts 34 electrically contact the stationary bias source contact 32 only when the respective planetary carrier 22 is aligned with the plasma PL. Thereby and as shown in dash line in FIG. 11 at 32' by appropriately dimensioning the azimuthal extent of either or of both of the contacts 34 and 32, one may control during which moving angle of the planetary carriers 22 bias voltage shall be supplied to the workpieces. In FIG. 11 such rotational angle of carousel base 20 during which a respective planetary carrier 22 is supplied with the bias voltage of bias source 30 is addressed by $\alpha$.

Thus, the switch which is established by the contact 32 on one hand and 34 on the other hand as of FIG. 11 establishes a controlled bias supply for the workpieces carried on the planetary carriers 22.

Turning back to the shielding technique which has been exemplified with the help of FIG. 10, FIG. 12 shows a further embodiment. Whereas the shielding plates 26 as of FIG. 10 are rather provided as material-catching shields, the shields as exemplified in FIG. 12 may be rather considered as workpiece or planetary carrier protective shields. On the carousel base 20 there is mounted for each of the planetary carriers 22 a protective shield 36 which surrounds the respective planetary carrier 22 which has a slit opening 38 radially pointing outwards from the carousel 20 with respect to the carousel axis $A_{20}$. Thus, the planetary carriers 22 are rotatably driven around their axes $A_{22}$ within the surrounding, protective shield 36. These shields too may be made easily exchangeable on the carousel base 20 so as to act as a replace part. Additionally, these protective shields 36 may act, with respect to the ion containing cloud (not shown in FIG. 12), as a diaphragm by their opening 38, concentrating ion interaction of the cloud with the workpieces on the planetary carriers 22 on a predetermined surface area.

The shields 36 are made of a metal and electrically operated in a floating manner or are made of a dielectric material. Additionally and in view of their diaphragm—forming openings 38, it is also possible, especially when using a plasma as an ion containing cloud, to operate the addressed protective shields 36 on a positive electrical potential, i.e. as an anode so as to improve ion focusing through opening 38. Thereby and as shown in FIG. 12 at 40, the border area of the addressed opening 38 may be tailored in a shape additionally increasing its focusing effect. Biasing the addressed protective shields 36 is schematically shown in FIG. 12 by the biasing source 42.

Providing the protective shields 36 does allow, similarly as was addressed in context with the shielding technique of FIG. 10, to reduce the spacing of neighboring planetary carriers 22 far below the distance $\Phi$ as was addressed in context with the embodiment of FIG. 8.

Up to now we have discussed the present invention whenever there is provided on the respective planetary carriers 22 a single workpiece which is substantially cylindrical and supported coaxially to the respective planetary axis $A_{22}$ or a multitude of workpieces which are arranged along a cylindrical surface with respect to the planetary axis $A_{22}$, whereat only the surfaces radially pointing outwards with respect to the respective planetary axes $A_{22}$ are to be etched.

Frequently, the workpieces have to be etched all around and are therefore as perfectly known to the skilled artisan self-rotatably suspended on the respective planetary carriers.

A planetary carrier 22a for this purpose is schematically shown in FIG. 13. Thereby, the planetary carriers 22a drivingly rotatable about their planetary axes $A_{22a}$, are provided with workpiece supports 44 grouped adjacent to and along the periphery of the planetary carriers 22a. Each of the workpiece supports 44, provided to carry a workpiece as e.g. a cutting tool, is drivingly rotatable about a workpiece support axis $A_{44}$.

So as to prevent redeposition of material which is etched by the ion containing cloud CL on workpieces which are supported on neighboring planetary carriers (not shown in FIG. 13) all the measures which have been discussed up to now in context with the FIGS. 8-12 may also be applied for such embodiment. Additionally and so as to prevent redeposition of material etched from one workpiece on a workpiece support 44 on workpieces on neighboring supports 44 at one and the same planetary carrier 22a, the ion density distribution of cloud CL may be further limited to the 50% density limit as was exemplified in context with FIGS. 3-6 as well as FIG. 8 in a distance as small as $\Phi_{44}$ according to the diameter of a workpiece support 44 or of a workpiece supported thereon respectively. Further, the shielding and bias control measures which were discussed up to now may be applied on the planetary carriers 22a rather or in addition to such measures applied to the carousel base 20 which were discussed in context with the FIGS. 8-12. Thus, in FIG. 13 there is shown applying collecting shield plates 46, in analogy to the shield plates 26 of FIG. 10 and/or of a controlled bias 50 in analogy to the controlled bias as was exemplified with the help of FIG. 11 and/or of protective shields 56 in analogy to such shields 36 as were exemplified with the help of FIG. 12.

As further shown in FIG. 8 in a further embodiment which may be combined with any of the other embodiments exemplified to now, there is provided along the center axis $A_{CL}$ a coil arrangement 58 which generates a focusing magnetic field H along the cloud CL containing ions.

An ion cloud source upon which a today used source is based for performing the present invention is disclosed in details in the PCT application PCT/EP2006/067869 of the same applicant, filed Oct. 27, 2006 and not published when the present application is first filed, which accords with U.S. application Ser. No. 11/870,119, filed Oct. 10, 2007 and which are incorporated in the present description by reference. A summary how the addressed cloud source is conceived will now be given with the help of FIG. 14. Thereby, it must be stated that the essential difference of the source according to the PCT/US applications to the ion cloud source as applied for practicing the present invention is that the confinement for practicing the present invention and in opposition to the confinement as disclosed in the addressed PCT/US applications has a diaphragm or orifice which restricts the plasma generated.

According to FIG. 14 there is provided in a vacuum chamber 60 which is evacuated by a pumping arrangement 63 an electron source cathode 65 and an anode arrangement 67. The anode arrangement 67 comprises an anode electrode 69 and a confinement 71. The confinement has, for operating the present invention, an orifice or diaphragm 72 pointing towards the reaction space R within the vacuum chamber 60. The confinement 71 defines for an inner space. The anode 69 provided within the inner space of confinement 71 with diaphragm 72 is electrically isolated from the confinement 71. The confinement 71 is made of a metal and/or of dielectric material, whereby in one embodiment at least the inner surface of the confinement 71 is of metal. The confinement 71 is operated on a floating electric potential with respect to the plasma potential of plasma PL, as was described above. For some additional controllability the confinement 71 may be operated on a predetermined or adjustable electrical potential as with respect to the wall of the vacuum chamber 1. The electron source cathode 65 and the anode electrode 69 are electrically supplied by a supply source 79 which generates a signal comprising a DC component or consisting of DC component with a polarity as shown in FIG. 14. Electrons generated by the electron source cathode 65 are propelled by the electric field from the emitting surface of the electron source cathode 65 towards the anode electrode 69. Due to the confinement 71 which is operated on an electric potential which is different from the electric potential of the anode electrode 69 in any case, there results an increased density of electrons within the confinement 71 and adjacent to its diaphragm 72. A working gas, e.g. Argon, Krypton or Xenon or a mixture thereof, is inlet into the vacuum chamber 60 and is ionized by the electron impact. Due to the increased electron density in the confinement 71 and adjacent to its diaphragm 72 there results in the addressed area an increased ionization rate of the working gas and, if applied, an increased activation of a reactive gas. Workpieces supported on the planetary carriers 22 or 22a on the carousel base 20 pass adjacent the diaphragm 72 and are etchingly exposed to the high density plasma PL which is concentrated to the limited area as was discussed to now also with the help of diaphragm 72. All the measures which were discussed up to now may separately or in combination be applied to the arrangement of FIG. 14 which merely shall disclose a plasma source which is used today for practicing the present invention. The electron source cathode 65 may thereby be e.g. a thermionic electron emitting cathode or an arc discharge cathode.

FIG. 15 shows an arrangement according to the present invention schematically which makes use of a cloud source as was exemplified with the help of FIG. 14, for etching complex, especially concave surfaces of workpieces 23, e.g. of so-called shoes.

By the present invention redeposition of material which has been etched from workpiece surfaces by ion impact upon surfaces at which such redeposition is undesired, especially on workpiece surfaces which should be kept clean or which shall be etched too, is prevented by respectively limiting a cloud containing etching ions, applying shielding members and/or selected biasing to the workpieces. Thereby, the net etching efficiency is significantly increased.

What is claimed is:

1. A method for manufacturing workpieces, at least a part of a surface of said workpieces being etched including etched by ion impact, comprising:
   providing a carousel base drivingly rotatable about a carousel axis;
   providing along a periphery of and on said carousel base at least two planetary carriers, each drivingly rotatable about a planetary axis parallel to said carousel axis;
   generating a cloud comprising ions and having, in a cross-sectional plane perpendicular to said carousel axis and perpendicular to said planetary axis, a center axis of said cloud in a center of an area of maximum ion density;
   directing said center axis so as to intersect with said carousel axis, in said cross-sectional plane;
   applying at least one workpiece to be etched on each of said planetary carriers, each of said planetary carriers defining by rotating about its planetary axis a diameter with respect to such planetary axis;
   said cloud comprising ions having an ion density dropping to 50% of maximum ion density of said cloud at a distance from said center axis which is at most equal to 50% of said diameter, in said cross-sectional plane, and at a locus of a moving path of said planetary axes;
   rotating said carousel base and said planetary carriers about said respective axes; and
   etching the workpieces as the workpiece are moved into and through said cloud.

2. The method of claim 1, wherein said cloud is generated substantially linearly extended in a height direction parallel to the planetary axes and perpendicular to said center axis.

3. The method of claim 1, comprising applying said workpieces eccentrically with respect to the respective planetary axis.

4. The method of claim 1, further comprising additionally preventing re-deposition of material momentarily etched from said workpieces to others of said workpieces by mutual shielding.

5. The method of claim 1, further comprising further concentrating said etching by selectively applying a higher negative bias voltage to one or more than one workpieces being momentarily etched than to workpieces momentarily not being etched.

6. The method of claim 1, said generating comprising shaping said cloud by a diaphragm, wherein said shaping is carried out through an electrically floating metallic diaphragm or through a dielectric diaphragm or through an anode diaphragm.

7. The method of claim 1, said generating comprising applying a magnetic field along said cloud.

8. The method of claim 1, thereby generating said cloud as a plasma.

9. The method of claim 1, said distance being at most equal to a quarter of said diameter.

10. The method of claim 3, further comprising the step of rotating each workpiece about a workpiece axis.

11. A method for manufacturing workpieces, at least a part of a surface of said workpieces being etched including etched by ion impact, comprising:
   providing a carousel base drivingly rotatable about a carousel axis;
   providing along a periphery of and on said carousel base at least two planetary carriers, each drivingly rotatable about a planetary axis parallel to said carousel axis;
   generating a cloud comprising ions and having, in a cross-sectional plane perpendicular to said carousel axis and perpendicular to said planetary axis, a center axis of said cloud in a center of an area of maximum ion density;
   directing said center axis so as to intersect with said carousel axis, in said cross-sectional plane;
   applying at least one workpiece to be etched on each of said planetary carriers, each of said planetary carriers defining by rotating about its planetary axis a diameter with respect to such planetary axis;
   said cloud comprising ions having an ion density dropping to 50% of maximum ion density of said cloud at a distance from said center axis which is at most equal to 50% of said diameter, in said cross-sectional plane, and at a locus of a moving path of said planetary axes;
   rotating said carousel base and said planetary carriers about said respective axes; and
   etching the workpieces as the workpiece are moved into and through said cloud,
   wherein said cloud is generated substantially linearly extended in a height direction parallel to the planetary axes and perpendicular to said center axis.

* * * * *

UNITED STATES PATENT AND TRADEMARK OFFICE
CERTIFICATE OF CORRECTION

PATENT NO. : 8,864,959 B2  
APPLICATION NO. : 12/427021  
DATED : October 21, 2014  
INVENTOR(S) : Siegfried Krassnitzer et al.

It is certified that error appears in the above-identified patent and that said Letters Patent is hereby corrected as shown below:

In the Specification,

Column 3, line 11; Please delete "Θ" and add -- ϑ --

Signed and Sealed this
Twelfth Day of May, 2015

Michelle K. Lee
*Director of the United States Patent and Trademark Office*